(12) United States Patent
Zhu

(10) Patent No.: US 9,137,921 B2
(45) Date of Patent: Sep. 15, 2015

(54) ASSEMBLED MODULE AND ELECTRONIC APPARATUS HAVING THE SAME

(71) Applicant: Wistron Corporation, New Taipei (TW)

(72) Inventor: Chong-Xing Zhu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 130 days.

(21) Appl. No.: 14/151,595

(22) Filed: Jan. 9, 2014

(65) Prior Publication Data

US 2015/0077920 A1 Mar. 19, 2015

(30) Foreign Application Priority Data

Sep. 13, 2013 (CN) .......................... 2013 1 0419162

(51) Int. Cl.
*G06F 1/16* (2006.01)
*H05K 7/14* (2006.01)
*H05K 5/00* (2006.01)

(52) U.S. Cl.
CPC .................................... *H05K 7/1487* (2013.01)

(58) Field of Classification Search
CPC ............... G06F 2200/202–2200/203; G06F 1/1601–1/1611; G06F 1/1613–1/1698; G06F 1/18–1/189; H05K 5/00–5/069; H05K 7/00–7/186
USPC ......... 361/686–723, 741–756, 807–810, 829, 361/676–678, 679.46–679.54, 725, 787, 361/789, 794; 348/787–794; 349/58–60
See application file for complete search history.

(56) References Cited

U.S. PATENT DOCUMENTS

| | | | | |
|---|---|---|---|---|
| 5,826,922 A * | 10/1998 | Wernig | | 292/39 |
| 6,394,509 B1 * | 5/2002 | Kurek, III | | 292/199 |
| 6,674,651 B2 * | 1/2004 | Momiyama et al. | | 361/796 |
| 7,245,499 B2 * | 7/2007 | Stahl et al. | | 361/754 |
| 7,283,371 B1 * | 10/2007 | Grouell et al. | | 361/741 |
| 2002/0001049 A1 * | 1/2002 | Endo et al. | | 349/58 |
| 2003/0174463 A1 * | 9/2003 | Chen | | 361/683 |
| 2004/0105226 A1 * | 6/2004 | Geeng | | 361/683 |
| 2004/0108995 A1 * | 6/2004 | Hoshino et al. | | 345/173 |
| 2005/0150435 A1 * | 7/2005 | Chen et al. | | 108/59 |
| 2005/0264983 A1 * | 12/2005 | Chen | | 361/681 |
| 2006/0219702 A1 * | 10/2006 | Lee | | 219/506 |
| 2006/0236329 A1 * | 10/2006 | Sugiura et al. | | 720/675 |
| 2006/0244700 A1 * | 11/2006 | Sano et al. | | 345/87 |
| 2007/0030647 A1 * | 2/2007 | Chen et al. | | 361/687 |
| 2010/0156255 A1 * | 6/2010 | Cheng et al. | | 312/223.2 |

(Continued)

*Primary Examiner* — Anthony Haughton
*Assistant Examiner* — Razmeen Gafur
(74) *Attorney, Agent, or Firm* — Muncy, Geissler, Olds & Lowe, P.C.

(57) ABSTRACT

An assembled module and an electronic apparatus having the same are disclosed. The assembled module is disposed in a case of the electronic apparatus. The assembled module includes a backplane and an actuating unit. The backplane is disposed on the case and used to be moved between a first position and a second position. The actuating unit is disposed on the backplane and used to be operated so as to drive the backplane moving relative to the first position and the second position. The actuating unit includes a first rack, a complex gear, and a second rack; wherein when the first rack is operated to move along a first direction, the complex gear is carried by the first rack to allow the second rack to move along a second direction, such that the assembled module is able to move between the first position and the second position.

23 Claims, 6 Drawing Sheets

(56) References Cited

U.S. PATENT DOCUMENTS

| | | | |
|---|---|---|---|
| 2010/0283934 A1* | 11/2010 | Wang | 349/58 |
| 2011/0127895 A1* | 6/2011 | Conn et al. | 312/294 |
| 2011/0304968 A1* | 12/2011 | Knopf et al. | 361/679.6 |
| 2012/0057292 A1* | 3/2012 | Ulrich | 361/679.32 |
| 2012/0186076 A1* | 7/2012 | Grady et al. | 29/739 |
| 2012/0307460 A1* | 12/2012 | Simon | 361/747 |

* cited by examiner

ASSEMBLED MODULE AND ELECTRONIC APPARATUS HAVING THE SAME

FIELD

The exemplary embodiment(s) of the present invention relates to an assembled module and an electronic apparatus having the same, more specifically, relates to an assembled module and an electronic apparatus having the same which are adapted on sever computer product and easy to be disassembled in a narrow space.

BACKGROUND

With the advance of technology, different types of electronic apparatuses have been widely used by users. Take electronic commerce and huge cloud computing demand which are developed vigorously as examples, they all need powerful, multi-functional, stable, and safe sever computer systems. Not only requiring the sever computer system having powerful and flexible for expending functions, users also want to reduce the volume of the sever computer casing, and thus more sever computers could be accommodated in the same size cabinet. Therefore, how to effectively arrange the space inside the sever computer casing but not affect the heat dissipating has become an important issue. According to prior art, in order to control the disk array and connect to the main board, an intermediate and removable control interface card is often installed between the disk array and the main board. However, the control interface card is usually installed by pluggable way on the main board and electrically connected to the circuit board of the disk array by a cable line, or directly installed by pluggable way on the circuit board connector of the disk array. Thus a larger operation space is needed for user plugging the extend interface card. If the operation space is too small, it would be inconvenient to the user to assemble or disassemble the control interface card, and the demand of reducing the volume would not be met.

Therefore, it has to invent a new assembled module and an electronic apparatus so as to solve the disadvantages of the prior arts.

SUMMARY

A main object of the present invention is to provide an assembled module having an effect of easy being disassembled.

Another main object of the present invention is to provide an electronic apparatus having the assembled module aforementioned.

In order to achieve the aforementioned objects, the assembled module of the present invention is disposed movably in a casing of an electronic apparatus. The assembled module comprises a backplane and an actuating unit. The backplane is disposed movably on the casing and configured to be moved between a first position and a second position. The actuating unit is disposed on the backplane and configured to be operated thereby driving the backplane moving relative to the casing between the first position and the second position. The actuating unit comprises a first rack, a complex gear and a second rack. The first rack is configured to be operated to move back and forth along a first direction. The complex gear includes a first gear and a second gear, the first gear and the second gear are co-axial and able to rotate simultaneously, and the first gear is engaged with the first rack and configured to rotate when the first rack is operated. The second rack is configured to be fixed on the casing along a second direction and engaged with the second gear, wherein, when the first rack is operated to move along the first direction, the first is thus driven to rotate, and so as to further rotate the second gear simultaneously rotating with the first gear relative to the second rack fixed on the casing, thereby moving the second gear along the second direction and moving the assembled module between the first position and the second position.

The electronic apparatus of the present invention comprises a casing, an electronic component and an assembled module. The electronic component is disposed in the casing and has at least one connecting port. The assembled module is disposed movably in the casing and adjacent to the electronic component, and is able to move to a first position to connect to the electronic component or move to a second position to depart from the connection with the electronic component. The assembled module comprises a backplane, an actuating unit and a circuit board. The backplane is disposed movably on the casing, and configured to be moved between a first position and a second position. The actuating unit is disposed on the backplane and configured to be operated thereby driving the backplane moving relative to the casing between the first position and the second position. The circuit, board has at least one contact terminal corresponding to the at least one connecting port. Wherein, when the assembled module moves to the first position, the contact terminal plugs into the connecting port thereby making the assembled module be electrically connected to the electronic component, and when the assembled module moves to the second position, the contact terminal departs from the connecting port thereby making the assembled module depart from being electrically connected with the electronic component.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

For facilitating understanding and clarifying the object, characteristics and advantages of the present invention, following specific embodiments and figures of the present invention are presented to make a detail description.

Figure 1:
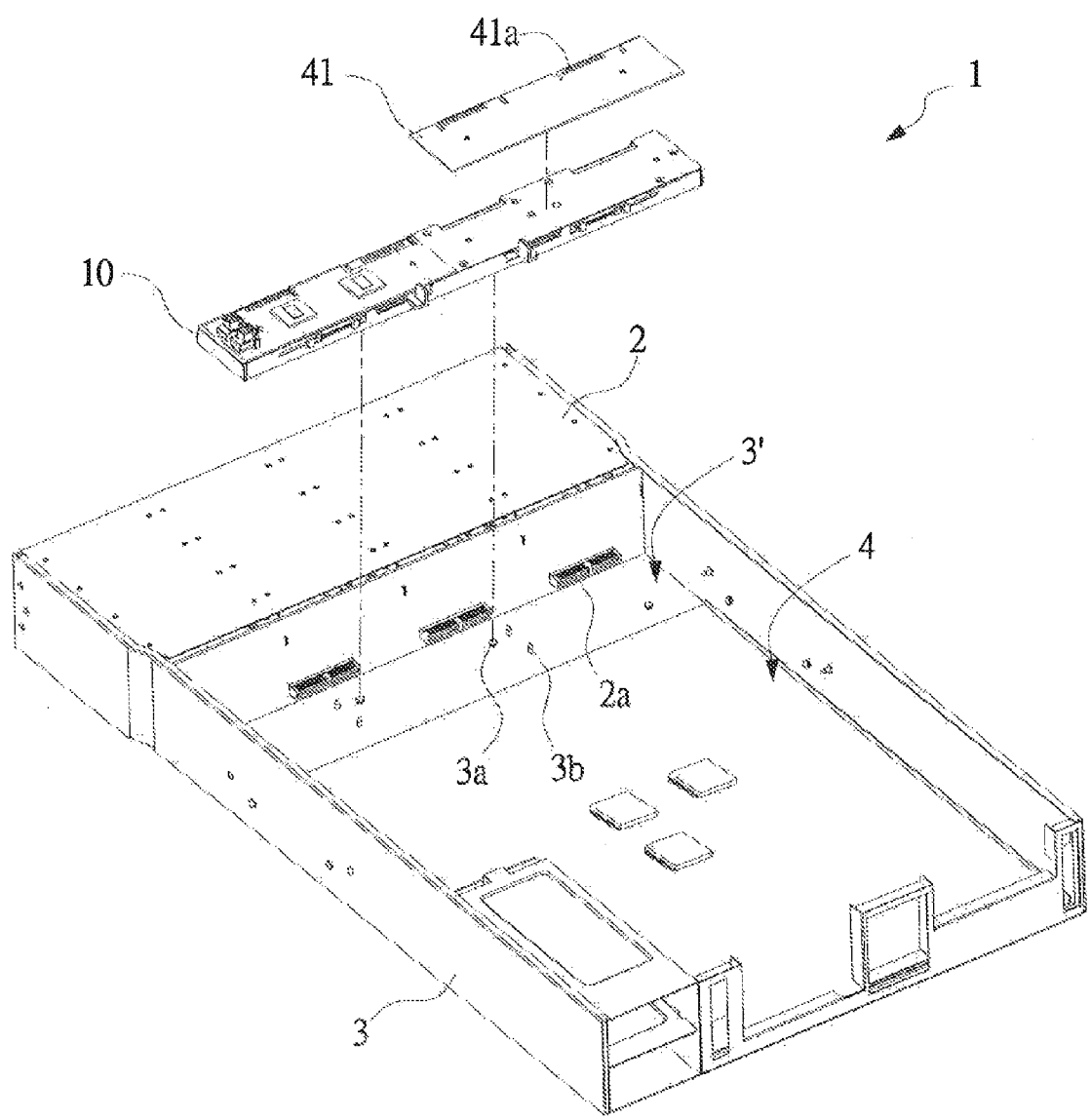
FIG. 1 is a structure schematic diagram of the assembled module being disposed in the electronic apparatus of the present invention.

Please first refer to FIG. 1, which is a structure schematic diagram of the assembled module being disposed in the electronic apparatus of the present invention.

The electronic apparatus 1 of the present invention comprises an electronic component 2, a casing 3, a main board 4, and an assembled module 10. The electronic component 2, the main board 4 and the assembled module 10 are disposed in the casing 3. A bottom casing 3' of the casing 3 has at least one engaging member 3a and at least one positioning column 3b at a proper place between the main board 4 and the electronic component 2. In FIG. 1, the casing 3 has two engaging members 3a and four positioning columns 3b, but the present invention is not limited thereto. By the corresponding structures (will be described later) of the engaging members 3a, the positioning columns 3b, and the assembled module 10, the assembled module 10 could be moved between the first position and the second position, wherein the first position is on the bottom casing 3' of the casing 3 and adjacent to the electronic component 2 and the second position is far away from the electronic component 2. Specifically, when the assembled module 10 is at the first position, the assembled module 10 mechanically and electrically connects to the electronic component 2 through the connecting port 2a. In one embodiment of the present invention, the electronic apparatus 1 is a sever computer, the electronic component 2 could be a Redundant Array of Independent Disks (RAID) and includes a plurality of hard disks or storage apparatuses, but the present invention is not limited thereto.

Figure 2:
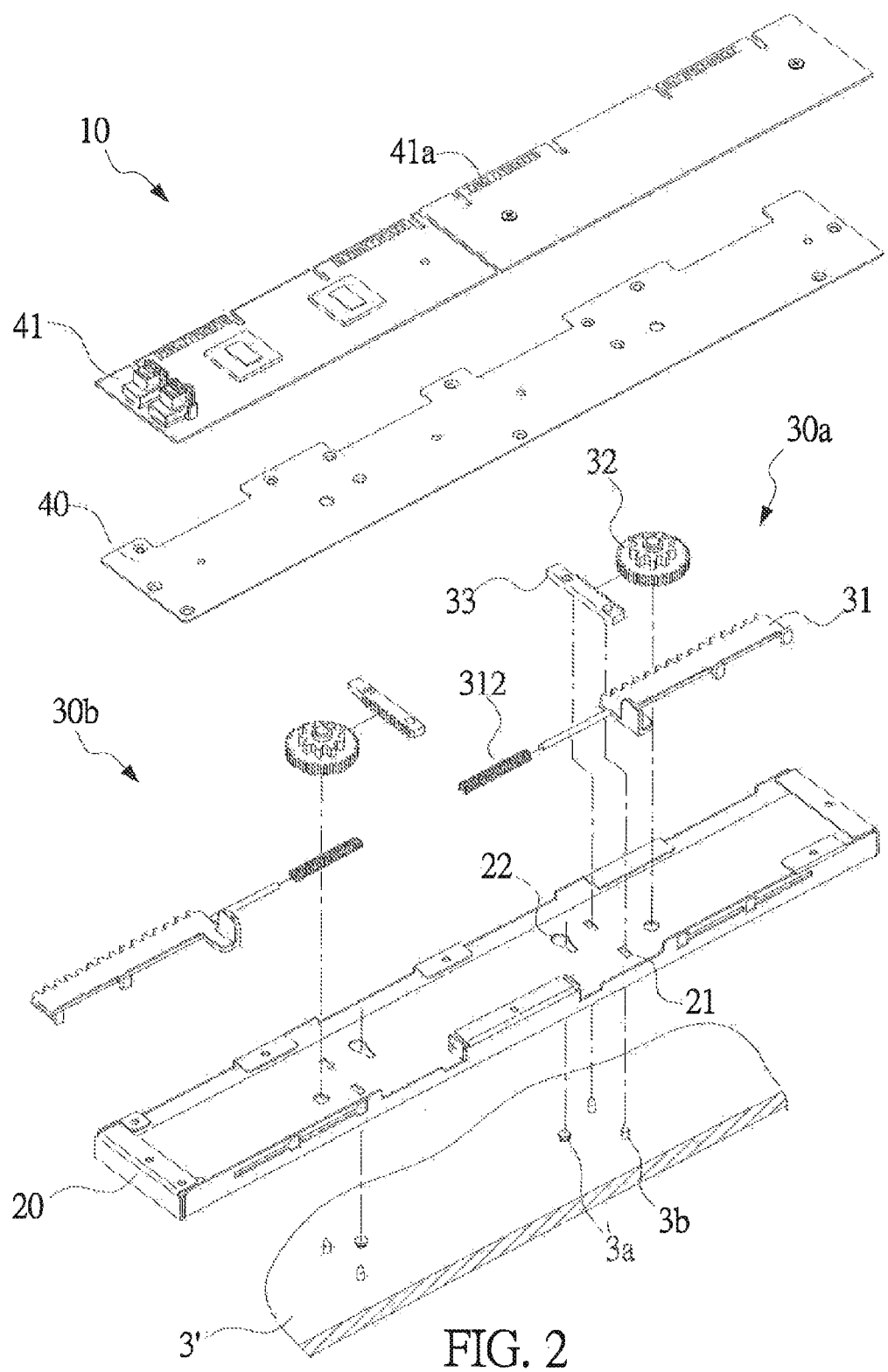
FIG. 2 is a structure schematic diagram of the assembled module of the present invention.

About the detail structure of the assembled module 10, please refer to FIG. 2, which is a structure schematic diagram of the assembled module of the present invention.

In one embodiment of the present invention, the assembled module 10 comprises a backplane 20, a first actuating unit 30a, a second actuating unit 30b, and a protection cover body 40. The backplane 20 is disposed on the casing 3 and able to be moved between the first position and the second position. The first actuating unit 30a and the second actuating unit 30b are disposed on the backplane 20 symmetrically, so as to let the user operate and move the assembled module 10 by one hand in one operation. The protection cover body 40 is used to cover the backplane 20, the first actuating unit 30a, and the second actuating unit 30b. A circuit board 41 having a contact terminal 41a could be disposed on the protection cover body 40, so as to mechanically and electrically connect to the electronic component 2 by the contact terminal 41a plugging in the connecting port 2a of the electronic component 2, and the circuit board 41 further connects to the main board 4 via a signal cable line. Therefore, the electronic apparatus 1 could control or access the electronic component 2 through the circuit board 41 of the assembled module 10.

Figure 3A:
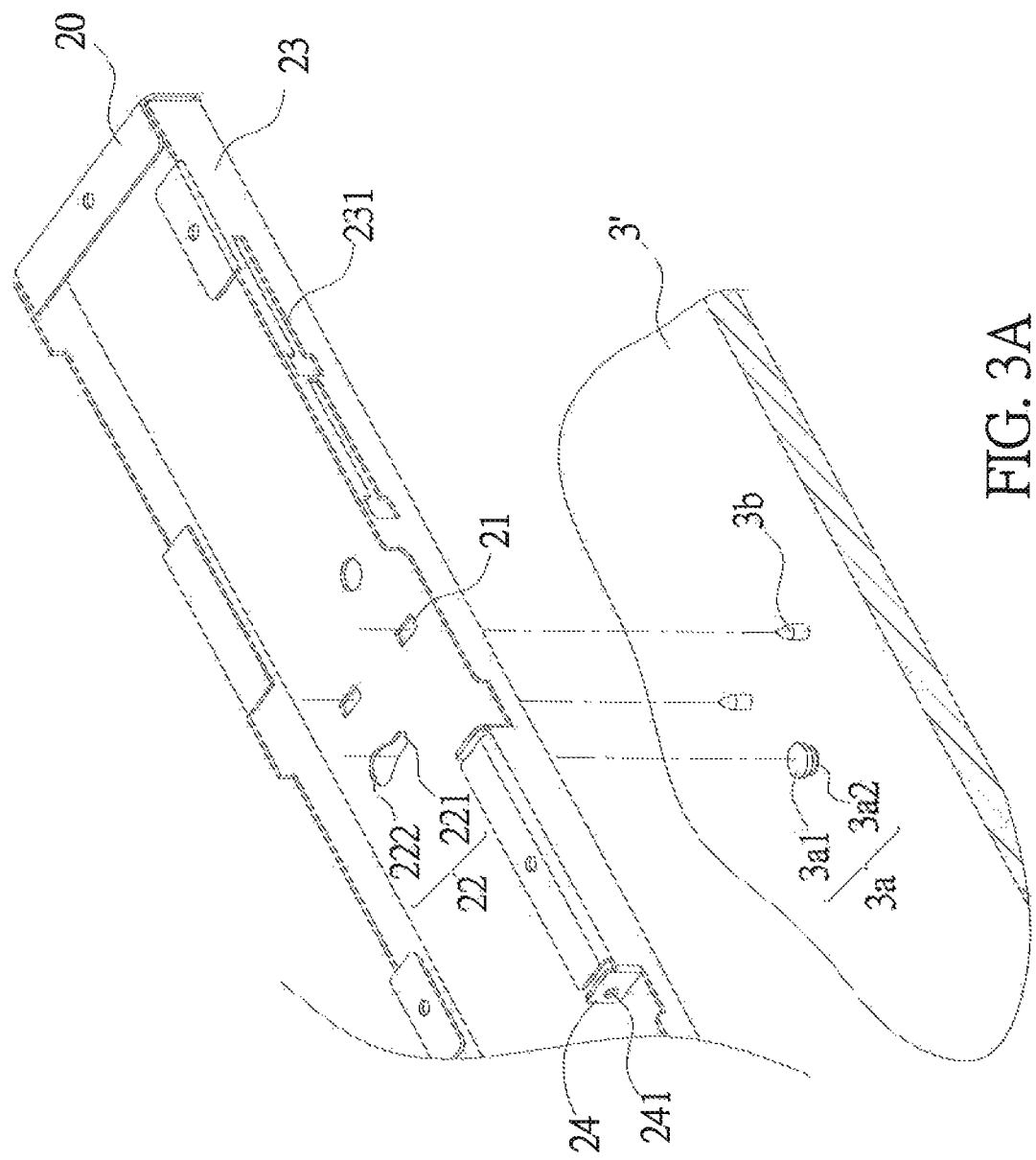
FIG. 3A is a structure schematic diagram of the backplane in the assembled module of the present invention.

At the same time please refer to FIG. 3A, which is a structure schematic diagram of the backplane in the assembled module of the present invention.

The backplane 20 has at least one slot 21 and at least one engaging hole 22. The positioning column 3b on the bottom casing 3' of the casing 3 penetrates through the slot 21. When the backplane 20 is at the first position, the engaging member 3a engages the engaging hole 22. In order to fit the number of the positioning column 3b and the engaging member 3a on the casing 3, the backplane 20 has four slots 21 and two engaging holes 22, but the present invention is not limited thereto. According to the magnified figure in FIG. 3A, the engaging hole 22 could be calabash-shaped and thus has a narrow end 221 and a wide end 222; and the engaging member 3a thus has a wide portion 3a1 and a narrow portion 3a2 correspondingly, and a width of the wide portion 3a1 is smaller than a width of the wide end 222 but bigger than a width of the narrow end 221, and a width of the narrow portion 3a2 is smaller than the width of the narrow end 221. Therefore, the engaging member 3a could match with the shape of the engaging hole 22 and engage the narrow end 221 of the engaging hole 22 by the wide portion 3a1 at a suitable time. When the backplane 20 is at the second position, the wide portion 3a1 of the engaging member 3a would move to the wide end 222 and thus depart from the engaging hole 22.

It has to be noted here that in one embodiment of the present invention, the assembled module 10 has two actuating units having same structure but opposite operation directions. The first actuating unit 30a and the second actuating unit 30b are taken as an example to describe, but the present invention is not limited thereto, the assembled module 10 could have single actuating unit or more than two actuating units, and the operation directions of different actuating units are not limited. When the backplane 20 is at the first position, the first actuating unit 30a and the second actuating unit 30b could be operated and moved simultaneously toward opposite direction by the user, so as to drive the backplane 20 moving from the first position to the second position, and thus let the assembled module 10 be able to depart from the electronic component 2 and leave the mechanical and electrical connection state. At this time, the engaging member 3a could depart from the engaging hole 22 so as to let the assembled module 10 be lifted upwardly and departed from the bottom casing 3' of the casing 3.

Figure 3B:
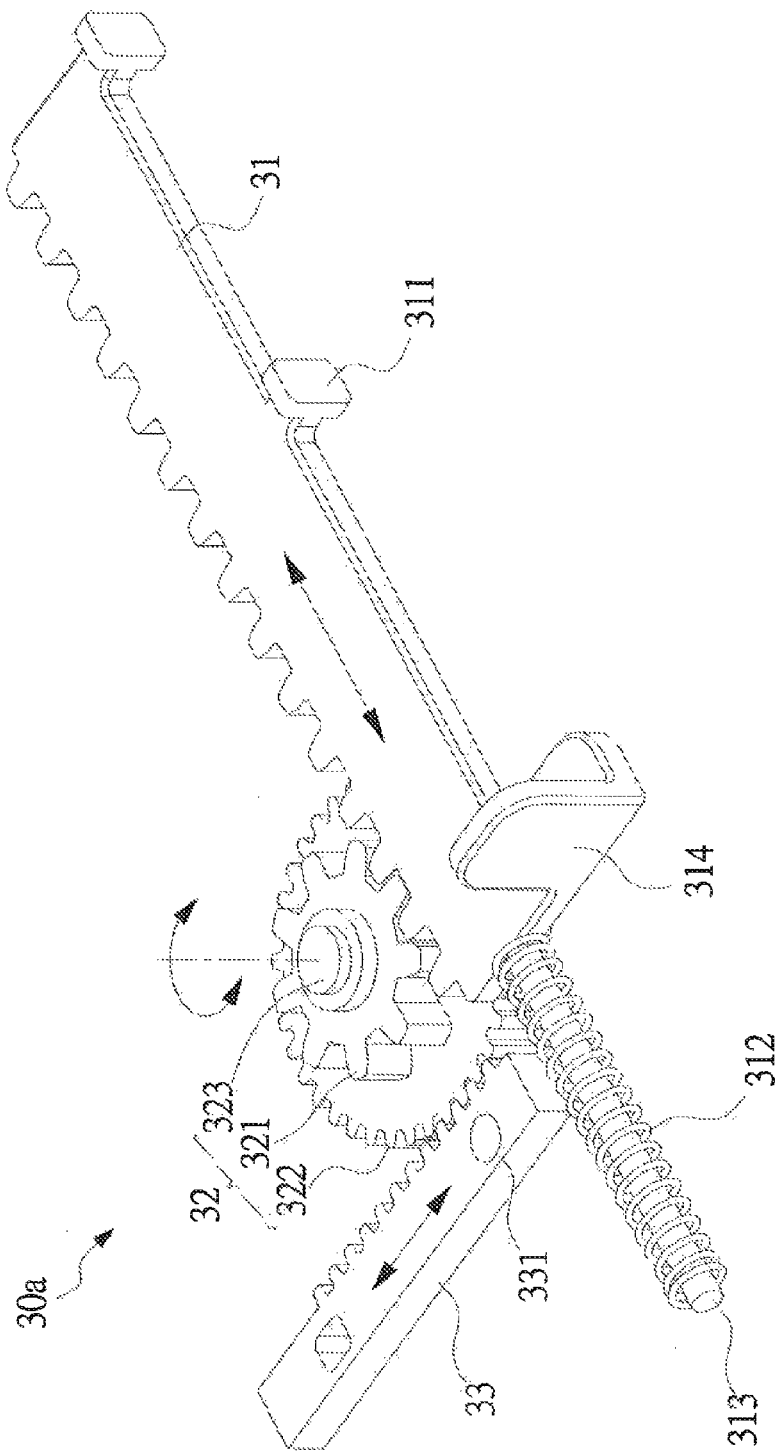
FIG. 3B is a structure schematic diagram of the actuating unit in the assembled module of the present invention.

Next please refer to FIG. 3B, which is a structure schematic diagram of the actuating unit in the assembled module of the present invention. Because the first actuating unit 30a and the second actuating unit 30b have the same structure, only the first actuating unit 30a as an example for being described hereinafter.

The first actuating unit 30a and the second actuating unit 30b both comprise a first rack 31, a complex gear 32 and a second rack 33. The first rack 31 could be operated by the user to move along the first direction back and forth. The first rack 31 has a hand-held portion 314, which could be anti-slip processed so as to let the user easy to operate. The complex gear 32 comprises a first gear 321, a second gear 322, and an axle core 323. The first gear 321 and the second gear 322 are co-axially connected with each other and connected to the axle core 323 pivotally. The axle core 323 is fixed on the backplane 20, or the first gear 321 and the second gear 322 connect and be fixed with the axle core 323 (e.g. integrally shaped), and the axle core 323 is connected to the backplane 20 pivotally. The first gear 321 is engaged with the first rack 31, the second rack 33 is engaged with the second gear 322, and the second rack 33 could be fastened on the casing 3 and disposed along the second direction. In this embodiment of the present invention, the first rack 31 and the second rack 33 are substantially perpendicular to each other, more specifically, the second rack 33 is parallel to the abovementioned moving direction from the first position to the second position, and the first rack 31 is perpendicular to this moving direction. When the positioning column 3b on the casing 3 penetrates through the slot 21, the positioning column 3b would be engaged with the hole 331 of the second rack 33, so as to limit the second rack 33 to move horizontally on the backplane 20. Thus, when the first rack 31 is operated to move along the first direction, the first gear 321 would be driven to rotate and further make second gear 322 which rotates synchronously rotate relative to the second rack 33 fastened on the casing, so as to move along the second direction and make the assembled module 10 move between the first position and the second position.

Take FIG. 3B as an example, when moving toward left, the first rack 31 would drives the complex gear 32 to rotate clockwise through the engagement with the first gear 321, and drives the second gear 322 to rotate clockwise synchronously. At this time, if the second rack 33 is not fastened, the second rack 33 would be moved upwardly due to the driving of the complex gear 32. Of course, when the moving toward right, the first rack 31 would drives the complex gear 32 to rotate counterclockwise, and thus makes the second gear 322 move downward due to the driving of the complex gear 32. However, if the second rack 33 is fixed by the positioning column 3b, the rotation of the complex gear 32 would cause including the first rack 31, the complex gear 32, and the backplane 20 installed to move along the direction opposite to the moving direction of the second rack 33 not being fixed. Therefore, when the first rack 31 moves toward left, the backplane 20 would thus be moved from the first position to the second position, and thus let the assembled module 10 be removed from the electronic component 2 and relieve the mechanical and electrical connection. At this time the engaging member 3a would move to the position able to depart from the engaging hole 22. Next, the user releases the positioning column 3b from the hole 331 of the second rack 33, so as to separate the assembled module 10 from the casing 3.

Besides, in order to let the first actuating unit 30a and the second actuating unit 30b slide at a fixed location, the backplane 20 further includes a side edge 23, and the side edge 23 has a sliding slot 231. The first rack 31 has a sliding block 311, the sliding block 311 is used for cooperating with the sliding slot 231, so as to let the first rack 31, i.e. the first actuating unit 30a and the second actuating unit 30b slide at the fixed location.

The first rack 31 further includes an elastic member 312, and the elastic member 312 could be a spring, but the present invention is not limited thereto. The backplane 20 has a stopping portion 24, one end of the elastic member 312 touches the stopping portion 24 of the backplane 20, and the other end is fixed on the first rack 31, thus it makes the elastic member 312 be operated between the first rack 31 and the backplane 20. Therefore, when the first rack 31 slides toward the left side as shown in FIG. 3B, the elastic member 312 would be pressed to generate a recover elastic force. In addition, the first rack 31 includes an extension bar 313 for female jointing the elastic member 312 to fix it. In order to match up with the displacement of the extension bar 313, an hole 241 is disposed in the center of the stopping portion 24, thus when the first rack 31 slides, the extension bar 313 would move in to the hole 241 and the first rack 31 could be back to the original position after moving by the recover force of the elastic member 312.

Figure 4:
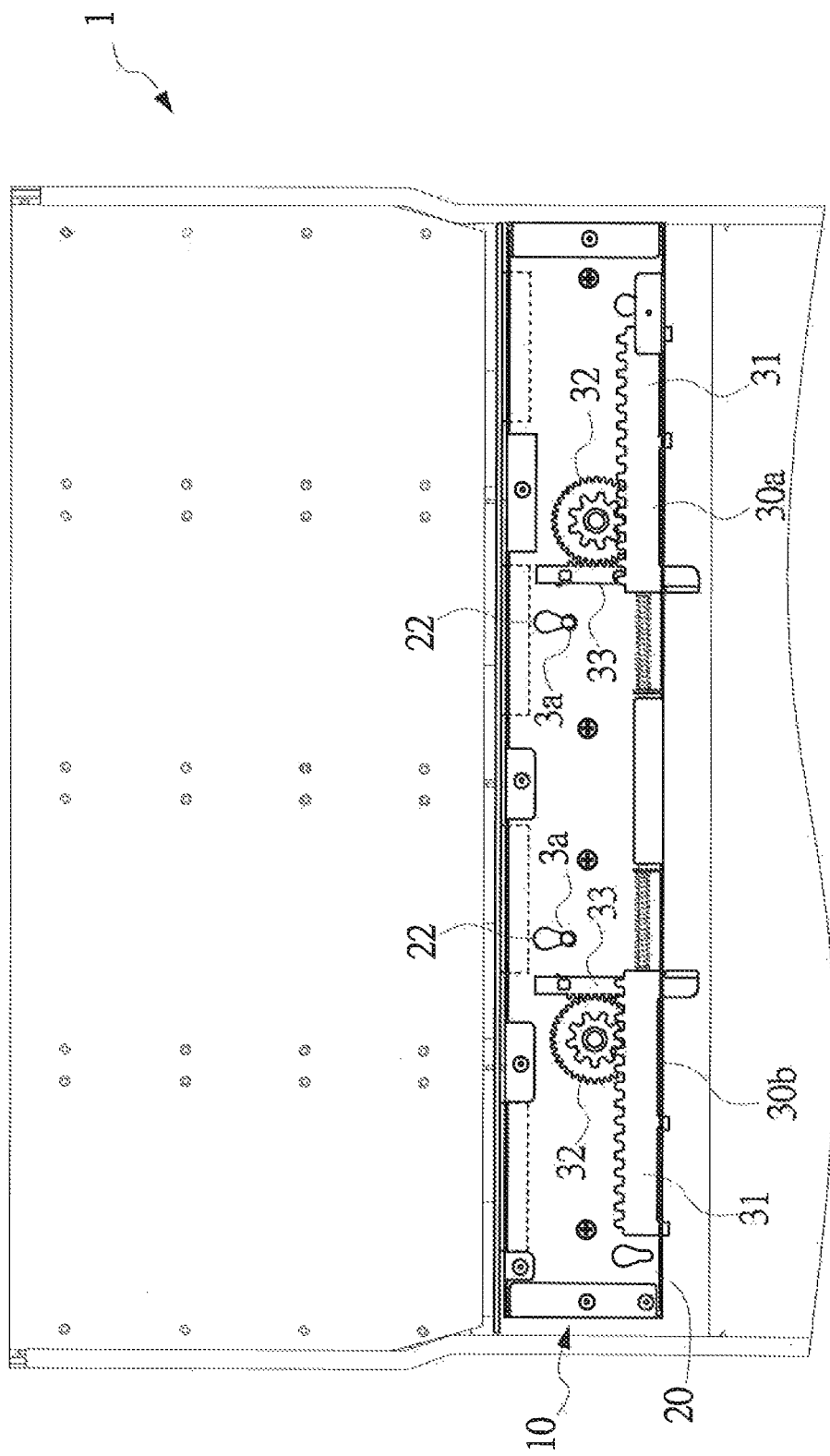
FIG. 4 is a schematic diagram of the assembled module at the first position of the present invention.

Next please refer to FIG. 4, which is a schematic diagram of the assembled module at the first position of the present invention.

By the aforementioned structure of the assembled module 10, when the backplane 20 is at the first position, the contact terminal 41a of the circuit board 41 on the assembled module 10 could be plugged in the connecting port 2a of the electronic component 2, thus makes the circuit board 41 connect to the electronic component 2 mechanically and electrically. At this time, the wide portion 3a1 of the engaging member 3a would be engaged the narrow end 221 of the engaging hole 22 so the assembled module 10 could not be moved freely. At this time, the first rack 31 also could not slide freely due to the elastic push force of the elastic member 312.

Figure 5:
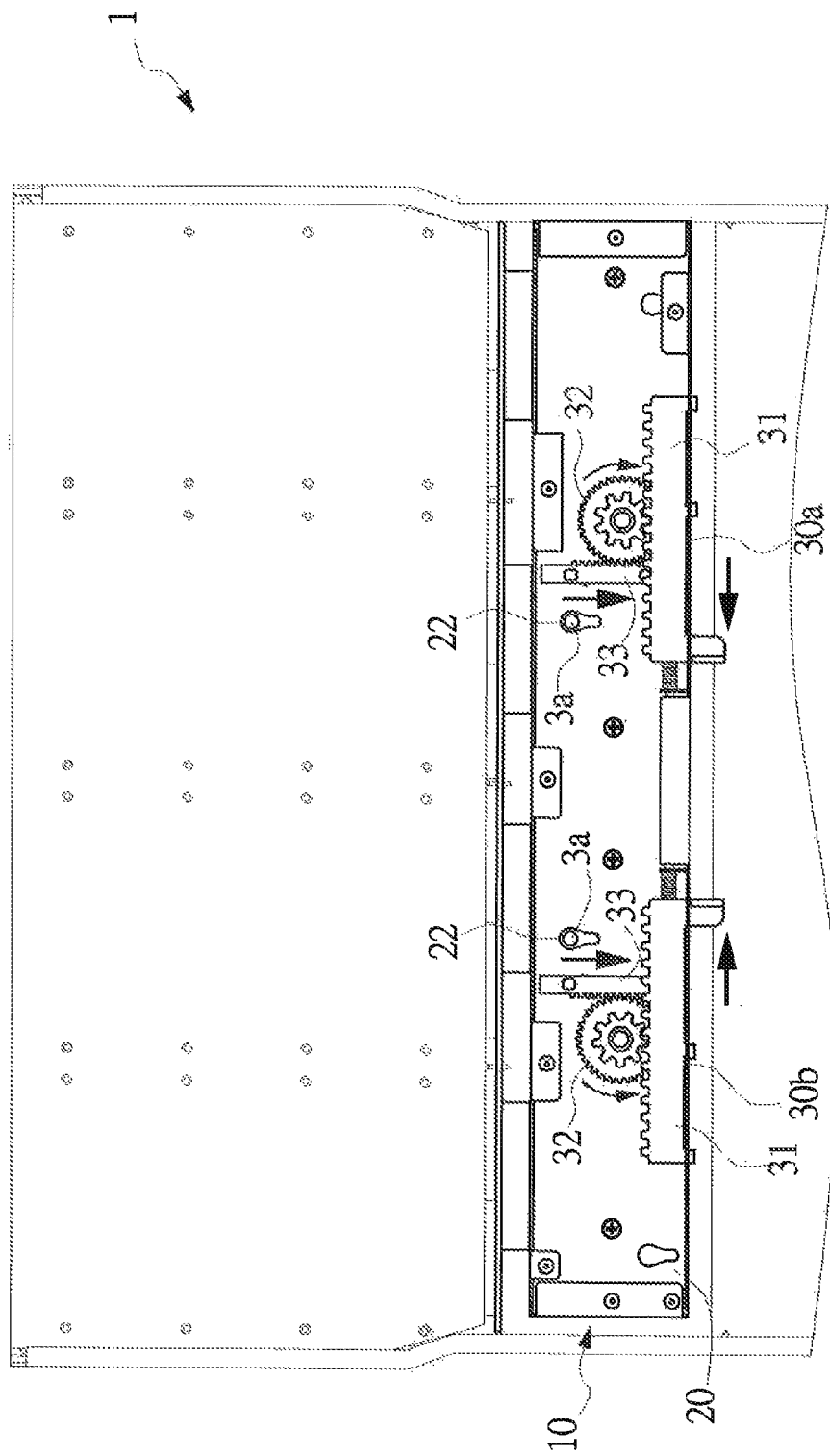
FIG. 5 is a schematic diagram of the assembled module at the second position of the present invention.

Final please refer to FIG. 5, which is a schematic diagram of the assembled module at the second position of the present invention.

When the user operates and moves the first actuating unit 30a and the second actuating unit 30b toward opposite direction simultaneously, the first rack 31 would drive the complex gear 32 to rotate and thus make the backplane 20 move backwardly relative to the second rack 33 from the first position to the second position. At this time the contact terminal 41a of the circuit board 41 on the assembled module 10 could depart from the connecting port 2a of the electronic component 2. Simultaneously, the wide portion 3a1 of the engaging member 3a would thus move to the wide end 222 of the engaging hole 22, so as to depart from the engaging hole 22. Therefore, the assembled module 10 could be departed from the casing 3 to be repaired or updated. If we want to assemble the assembled module 10 with the casing 3, first put the assembled module 10 at the second position (as shown in FIG. 5), and then put the assembled module 10 forwardly to the first position (as shown in FIG. 4). The wide portion 3a1 could thus be engaged with the narrow end 221 of the engaging hole 22, so as to fix the assembled module 10 on the casing 3.

By the novel mechanism design of the assembled module 10 of the present invention, the assembling and disassembling could be easily completed in the casing 3 of the electronic apparatus 1 without the need of huge operation space.

In summary, regardless of the function, way and result of the present invention are shown different technical characteristics to prior arts, and it is a great break. Examiners would be appreciated to allow this patent after realizing the content of the present invention so as to benefit the society. However, the aforementioned embodiments are just for illustrating the principle and the result of the present invention, but not for limiting the range of the present invention. It will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. An assembled module, disposed movably in a casing of an electronic apparatus, comprising:
   a backplane, disposed movably on the casing, and used to be moved between a first position and a second position; and
   an actuating unit, disposed on the backplane, and used to be operated so as to drive the backplane moving relative to the casing between the first position and the second position; the actuating unit comprising:
   a first rack, used to be operated to move back and forth along a first direction;
   a complex gear, comprising a first gear and a second gear able to be co-axial and rotate simultaneously, wherein the first gear is engaged with the first rack and used to rotate when the first rack is operated; and
   a second rack, used to be fixed on the casing along a second direction and engaged with the second gear;
   wherein, when the first rack is operated to move along the first direction, the first gear is thus driven to rotate, and so as to further rotate the second gear simultaneously rotating with the first gear relative to the second rack fixed on the casing to move along the second direction, such that the assembled module is able to move between the first position and the second position.

2. The assembled module as claimed in claim 1, wherein the first direction and the second direction are substantially perpendicular to each other.

3. The assembled module as claimed in claim 1, wherein the casing has at least one engaging member, and the backplane has at least one engaging hole correspondingly, when the backplane is located at the first position, the engaging member engages the engaging hole, and when the backplane is located at the second position, the engaging member departs from being engaged with the engaging hole.

4. The assembled module as claimed in claim 3, wherein the at least one engaging hole has a narrow end and a wide end, the at least one engaging member has a narrow portion and a wide portion, a width of the wide portion is smaller than a width of the wide end but bigger than a width of the narrow end, and a width of the narrow portion is smaller than the width of the narrow end; when the backplane is located at the first position, the wide portion engages the narrow end, and when the backplane moves to the second position from the first position, the wide portion thus moves to the wide end and make the at least one engaging member depart from the at least one engaging hole.

5. The assembled module as claimed in claim 1, wherein the casing has at least one positioning column, and the backplane has at least one positioning hole correspondingly, when the assembled module is disposed on the casing, the positioning column could penetrate the positioning hole correspondingly to fasten the second rack.

6. The assembled module as claimed in claim 1, wherein:
    the backplane further comprises a side edge, and the side edge has a sliding slot;
    the first rack has a sliding block, the sliding block is used for cooperating the sliding block to make the first rack slide along the first direction back and forth.

7. The assembled module as claimed in claim 1, wherein the assembled module further comprises an elastic member, the elastic member is operated between the first rack and the backplane so as to provide a recover elastic force when the first rack is operated.

8. The assembled module as claimed in claim 7, wherein:
    the backplane has a stopping portion disposed on the place corresponding to the elastic member, the first rack comprises an extension bar for female jointing the elastic member, so as to make the elastic member operate between the first rack and the stopping portion.

9. The assembled module as claimed in claim 1 further comprising a protection cover body for covering the backplane and the actuating unit.

10. The assembled module as claimed in claim 9, wherein the protection cover body is used for disposing a circuit board.

11. The assembled module as claimed in claim 1, wherein the first rack has a hand-held portion.

12. An electronic apparatus, comprising:
    a casing;
    an electronic component, disposed in the casing and having at least one connecting port; and
    an assembled module, disposed movably in the casing and adjacent to the electronic component, being able to move to a first position to connect to the electronic component or move to a second position to depart from the connection with the electronic component; the assembled module comprising:
    a backplane, disposed movably on the casing, and used to be moved between a first position and a second position; and
    an actuating unit, disposed on the backplane, and used to be operated so as to drive the backplane moving relative to the casing between the first position and the second position; and
    a circuit board, having at least one contact terminal corresponding to the at least one connecting port;
    wherein, when the assembled module moves to the first position, the contact terminal plugs into the connecting port so as to make the assembled module be electrically connected to the electronic component, and when the assembled module moves to the second position, the contact terminal departs from the connecting port so as to make the assembled module depart from being electrically connected with the electronic component.

13. The electronic apparatus as claimed in claim 12, wherein the electronic apparatus is a server computer, and the electronic component is a disk array, the circuit board of the assembled module is configured to control the disk array.

14. The electronic apparatus as claimed in claim 12, wherein the actuating unit comprises:
    a first rack, used to be operated to move back and forth along a first direction;
    a complex gear, comprising a first gear and a second gear able to be co-axial and rotate simultaneously, wherein the first gear is engaged with the first rack and used to rotate when the first rack is operated; and
    a second rack, used to be fixed on the casing along a second direction and engaged with the second gear;
    wherein, when the first rack is operated to move along the first direction, the first is thus driven to rotate, and so as to further rotate the second gear simultaneously rotating with the first gear relative to the second rack fixed on the casing to move along the second direction, such that the assembled module is able to move between the first position and the second position.

15. The electronic apparatus as claimed in claim 14, wherein the first direction and the second direction are substantially perpendicular to each other.

16. The electronic apparatus as claimed in claim 14, wherein the casing has at least one engaging member, and the backplane has at least one engaging hole correspondingly, when the backplane is located at the first position, the engaging member engages the engaging hole, and when the backplane is located at the second position, the engaging member departs from being engaged with the engaging hole.

17. The electronic apparatus as claimed in claim 16, wherein the at least one engaging hole has a narrow end and a wide end, the at least one engaging member has a narrow portion and a wide portion, a width of the wide portion is smaller than a width of the wide end but bigger than a width of the narrow end, and a width of the narrow portion is smaller than the width of the narrow end; when the backplane is located at the first position, the wide portion engages the narrow end, and when the backplane moves to the second position from the first position, the wide portion thus moves to the wide end and make the at least one engaging member depart from the at least one engaging hole.

18. The electronic apparatus as claimed in claim 16, wherein the assembled module includes two symmetric actuating units, the two symmetric actuating units are operated along opposite directions so as to make the assembled module be able to move between the first position and the second position.

19. The electronic apparatus as claimed in claim 14, wherein the casing has at least one positioning column, and the backplane has at least one positioning hole correspondingly, when the assembled module is disposed on the casing, the positioning column could penetrate the positioning hole correspondingly to fasten the second rack.

20. The electronic apparatus as claimed in claim 14, wherein:
    the backplane further comprises a side edge, and the side edge has a sliding slot;
    the first rack has a sliding block, the sliding block is used for cooperating the sliding block to make the first rack slide along the first direction back and forth.

21. The electronic apparatus as claimed in claim 14, wherein:
the first rack further comprises an elastic member, the elastic member is operated between the first rack and the backplane so as to provide a recover elastic force when the first rack is operated.

22. The electronic apparatus as claimed in claim 14, wherein the first rack has a hand-held portion.

23. The electronic apparatus as claimed in claim 12 further comprising a protection cover body for covering the backplane and the actuating unit, and the circuit board is disposed on the protection cover body.

\* \* \* \* \*